(12) United States Patent
Shah

(10) Patent No.: US 8,384,464 B1
(45) Date of Patent: Feb. 26, 2013

(54) LOW JITTER CLOCK INTERPOLATOR

(75) Inventor: Jatan Shah, Irvine, CA (US)

(73) Assignee: Mobius Semiconductor, Inc., Irvine, CA (US)

( * ) Notice: Subject to any disclaimer, the term of this patent is extended or adjusted under 35 U.S.C. 154(b) by 21 days.

(21) Appl. No.: 13/084,453

(22) Filed: Apr. 11, 2011

Related U.S. Application Data

(60) Provisional application No. 61/324,017, filed on Apr. 14, 2010.

(51) Int. Cl.
*G06F 1/04* (2006.01)
(52) U.S. Cl. ......................................... 327/291; 327/298
(58) Field of Classification Search .................. 375/308, 375/334, 335; 327/231, 232, 355, 291, 293, 327/295, 298
See application file for complete search history.

(56) References Cited

U.S. PATENT DOCUMENTS 5,764,113 A * 6/1998 Snell .............................. 332/103
2010/0110848 A1 * 5/2010 Honma ...................... 369/47.48

* cited by examiner

*Primary Examiner* — An Luu
(74) *Attorney, Agent, or Firm* — Kauth, Pomeroy, Peck & Bailey LLP

(57) ABSTRACT

Low jitter clock interpolator circuits in accordance with embodiments of the invention are illustrated. In many embodiments, the low jitter clock interpolator incorporates a time based numerically controlled oscillator (NCO) to generate a clock signal, and different phases of the resulting clock are created using a clock interpolator. Information from the time based NCO and the interpolator is then used to select phases and create an output clock that is jitter free within the precision of the interpolator. One embodiment of the invention includes a time based numerically controlled oscillator (NCO) configured to produce a NCO output in response to a high speed clock (hsclk) input and a frequency control word (FCW), where the output periods of the NCO output are integer multiples of the hsclk period and the average output period of the NCO output corresponds to the FCW, a clock interpolator circuit configured to receive the NCO output and the hsclk input and to generate a plurality of different phases of the NCO output, and a phase calculator circuit configured to select phases generated by the clock interpolator to produce a low jitter clock signal output having an output period that corresponds to the FCW.

21 Claims, 8 Drawing Sheets

LOW JITTER CLOCK INTERPOLATOR

RELATED APPLICATION

This application claims priority to U.S. Provisional Patent Application 61/324,017 filed Apr. 14, 2010, the disclosure of which is incorporated herein by reference.

BACKGROUND

The present invention relates generally to numerically controlled oscillator circuits and more specifically to low jitter numerically clock oscillators.

A numerically controlled oscillator (NCO) can generate a slower clock signal given a frequency control word (FCW) and a high speed clock (hsclk). The NCO can be time based or frequency based. The FCW of a time based NCO represents the time period of the output clock frequency to be generated. The larger the value of the FCW, the longer the period of the output clock signal and hence the lower its frequency. The FCW of a frequency based FCW represents the frequency of the output clock signal to be generated by the NCO. The larger the value of the FCW, the higher the frequency of the output clock signal and the shorter its period.

A time based NCO is typically implemented as a continuous down counter which counts down from the value of the FCW to 1 and then repeats. A typical time based NCO is illustrated in FIG. 1. As can be seen in FIG. 2, an output pulse is generated by the time based NCO every time the counter crosses the 1 value.

A frequency based NCO is typically implemented as an accumulator. A frequency based NCO is illustrated in FIG. 3. The accumulator accumulates the FCW every clock cycle and the output is the overflow status of the accumulator. As can be seen in FIG. 4, a pulse is generated every time the accumulator wraps around the maximum value. The larger the value of the FCW, the more frequently the accumulator wraps around and hence the higher the frequency of the output. The output pukes are non-uniformly distributed and are generated at an average frequency equal to $(FCW*f\_hsclk)/2^N$ where N is the bit width of the accumulator and f_hsclk is the frequency of the high speed clock signal.

A benefit of utilizing a time based NCO is that the output samples are uniform. However, the output periods of a time based NCO are typically limited to integer multiples of the hsclk period. A frequency based NCO can on average generate periods that are not multiples of the high speed clock period. The frequency of the output of a frequency based NCO is, however, limited to multiples of $f\_hsclk/2^N$.

SUMMARY OF THE INVENTION

Low jitter clock interpolators incorporating time based NCOs that enable the generation of output signals having arbitrary clock periods in accordance with embodiments of the invention are described. Low jitter clock interpolators in accordance with embodiments of the invention can also be used to arbitrarily reduce the clock jitter of a time based NCO to a bounded value.

One embodiment of the invention includes a time based numerically controlled oscillator (NCO) configured to produce a NCO output in response to a high speed clock (hsclk) input and a frequency control word (FCW), where the output periods of the NCO output are integer multiples of the hsclk period and the average output period of the NCO output corresponds to the FCW, a clock interpolator circuit configured to receive the NCO output and the hsclk input and to generate a plurality of different phases of the NCO output, and a phase calculator circuit configured to select phases generated by the clock interpolator to produce a low jitter clock signal output having an output period that corresponds to the FCW.

In a further embodiment, the jitter in the low jitter clock signal output is within the precision of the phases generated by the clock interpolator circuit.

In another embodiment, a plurality of bits of the FCW are indicative of an integer part of the FCW, a plurality of bits of the FCW are indicative of a fractional part of the FCW, the time based NCO accumulates the fractional part of the FCW, and the phase calculator circuit selects a phase generated by the clock interpolator circuit based upon the accumulated fractional part of the FCW.

In a still further embodiment, the NCO includes a first adder configured to add the bits corresponding to the fractional part of the FCW to an accumulated value stored in a first buffer and to output the sum to the first buffer and to provide an overflow bit output in response to overflow of the first adder, a second adder configured to sum the bits corresponding to the integer part of the FCW with the overflow bit output of the first adder and to provide the sum to a second buffer, and a down counter configured to load the value from the second buffer, count down to 1 and generate a puke on the NCO output when the count equals 1.

In still another embodiment, the clock interpolator circuit includes a tapped delay line configured to receive the NCO output as an input, and a multiplexer configured to select a tap from the tapped delay line as the low jitter clock signal output in response to an input received from the phase calculator circuit.

In a yet further embodiment, the phase calculator circuit is configured to scale the accumulated fractional part of the FCW and to provide the result to the multiplexer to select a tap from the tapped delay line as the low jitter clock signal output.

In yet another embodiment, the tapped delay line includes a minimum number of taps so as to span at least one high speed clock period, and the phase calculator circuit is configured to calibrate the gain so as to exclude at least one tap at the end of the delay line so that the delay of the remaining taps span a hsclk period.

In a further embodiment again, the clock interpolator circuit includes a current starved delay line configured to receive the NCO output as an input, were the gains of the delays in the current starved delay line are controlled via a plurality of current digital to analog converters, and a multiplexer configured to select a tap from the current starved delay line as the low jitter clock signal output in response to an input received from the phase calculator.

In another embodiment again, the phase calculator circuit is configured to control the gains of the delays in the current starved delay line using the digital to analog converters and to provide the accumulated fractional part of the FCW to the multiplexer to select a tap from the tapped delay line as the low jitter clock signal output.

In a further additional embodiment, the phase calculator circuit is configured to calibrate the gains of the delays in the current starved delay line so that the current starved delay line spans a single hsclk period.

An embodiment of the method of the invention includes generating a clock output using a time based numerically controlled oscillator (NCO) in response to a high speed clock (hsclk) input and a frequency control word (FCW) input, where the output periods of the clock output are integer multiples of the hsclk period and the average output period of the clock output corresponds to the FCW, interpolating the clock output using a clock interpolator circuit to produce a plurality of clock output phases, and selecting clock output phases using a phase calculator circuit to produce a low jitter clock output having an output period that corresponds to the FCW.

In a further embodiment of the method of the invention, generating a clock output using a time based NCO in response to the hsclk input and the FCW input further includes accumulating a plurality of bits of the FCW that are indicative of a fractional part of the FCW in the NCO, and selecting clock output phases using a phase calculator circuit to produce a low jitter clock output having an output period that corresponds to the FCW, further includes selecting clock output phases from the clock interpolator using the phase calculator circuit based upon the accumulated fractional part of the FCW.

In another embodiment of the method of the invention, accumulating a plurality of bits of the FCW that are indicative of a fractional part of the FCW in the NCO includes accumulating a fractional part of the FCW in a first buffer by adding the plurality of bits from the FCW control word corresponding to a fractional part of the FCW and the previous value in the first buffer, and generating a clock output using a time based NCO in response to the hsclk input and the FCW input further includes providing an overflow bit output to a second adder in response to an overflow of the first adder, accumulating an integer part of the FCW in a second buffer by adding the plurality of bits from the FCW corresponding to the integer part of the FCW and the overflow bit output by the first adder using the second adder, loading the value in the second buffer into a down counter circuit when a clock output pulse is generated, and counting down from the value loaded into the down counter circuit and generating a clock output pulse when the count equals 1.

In a still further embodiment of the method of the invention, interpolating the clock output using a clock interpolator circuit to produce a plurality of clock output phases further comprises providing the clock output to a delay line having a plurality of delayed outputs.

In still another embodiment of the method of the invention, selecting clock output phases from the clock interpolator using the phase calculator circuit based upon the accumulated fractional part of the FCW further includes selecting one of the outputs of the delay line as the low jitter clock output using a multiplexer based upon the accumulated fractional part of the FCW.

In a yet further embodiment of the method of the invention, the delay line is a tapped delay line.

In yet another embodiment of the method of the invention, the tapped delay line includes a minimum number of taps so as to span at least one high speed clock period.

In a further additional embodiment of the method of the invention, selecting one of the outputs of the delay line as the low jitter clock output using a multiplexer based upon the accumulated fractional part of the FCW further includes scaling the accumulated fractional part of the FCW by a gain factor using the phase calculator circuit, and providing the scaled accumulated fractional part of the FCW to the multiplexer to select an output of the delay line.

Another additional embodiment of the method of the invention further includes calibrating the gain factor so as to exclude at least one tap at the end of the delay line so that the delay of the remaining taps span a hsclk period.

In a still yet further embodiment of the method of the invention, the delay line is a current starved delay line.

In still yet another embodiment of the method of the invention, selecting one of the outputs of the delay line as the low jitter clock output using a multiplexer based upon the accumulated fractional part of the FCW further includes calibrating the gains of the delays in the current starved delay line using the phase calculator so that the current starved delay line spans one hsclk period, and providing the accumulated fractional part of the FCW to the multiplexer to select an output of the delay line.

DETAILED DESCRIPTION OF THE INVENTION

Turning now to the drawings, low jitter clock interpolator circuits in accordance with embodiments of the invention are illustrated. In many embodiments, the low jitter clock interpolator circuit incorporates a time based numerically controlled oscillator (NCO) to generate a clock signal, and different phases of the resulting clock are created using a clock interpolator circuit. Information from the time based NCO and the interpolator is then used to select phases and create an output clock that is jitter free within the precision of the interpolator. In many embodiments, the clock interpolator circuit is a tapped delay line that introduces delays that are fractions of a high-speed clock period. An appropriate output of the tapped delay line can be selected each clock period to provide a low jitter clock signal. In several embodiments, the delay introduced by the delays in the tapped delay line is unknown due to variations in the manufacturing process. Therefore, the output from the tapped delay line is observed by a phase calculator to determine whether a selected tap introduces a delay appropriate to the frequency control word (FCW) provided to the time based NCO. Low jitter clock interpolator circuits and methods for generating low jitter clock signals in accordance with embodiments of the invention are discussed further below.

Figure 1:
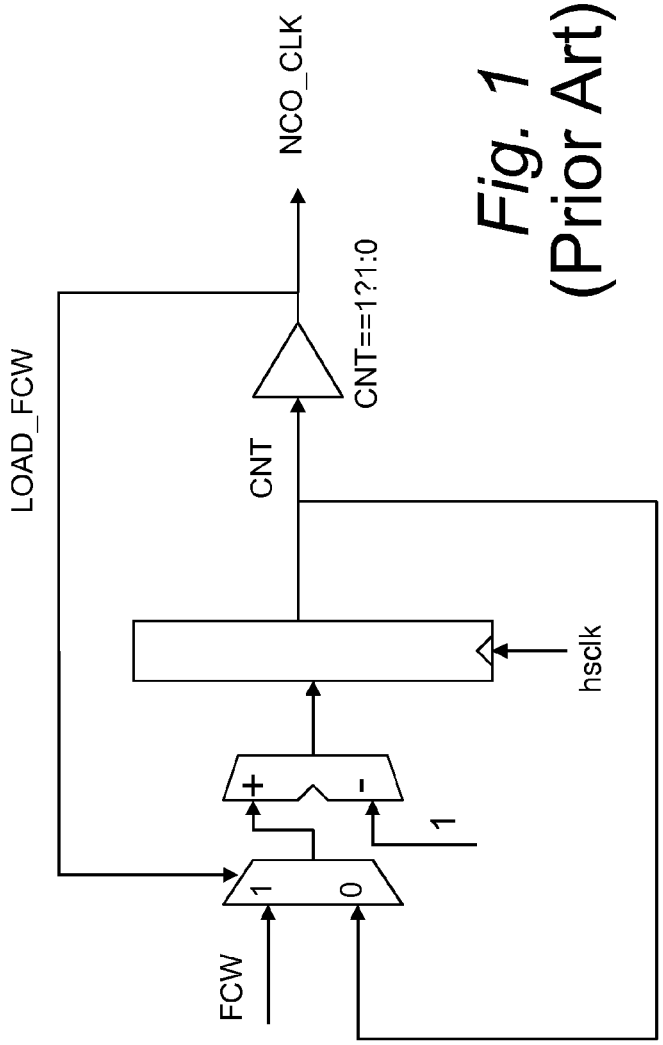
FIG. 1 is a block diagram illustrating a typical time based numerically controlled oscillator circuit.
Figure 2:
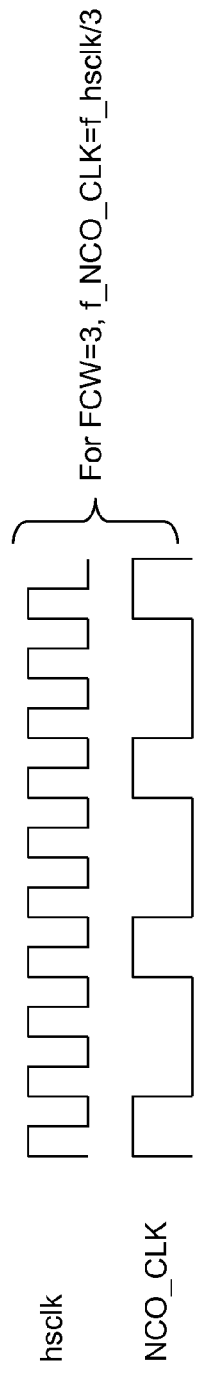
FIG. 2 illustrates a high speed clock signal input to a time based numerically controlled oscillator and the clock signal output by the time based numerically controlled oscillator.
Figure 3:
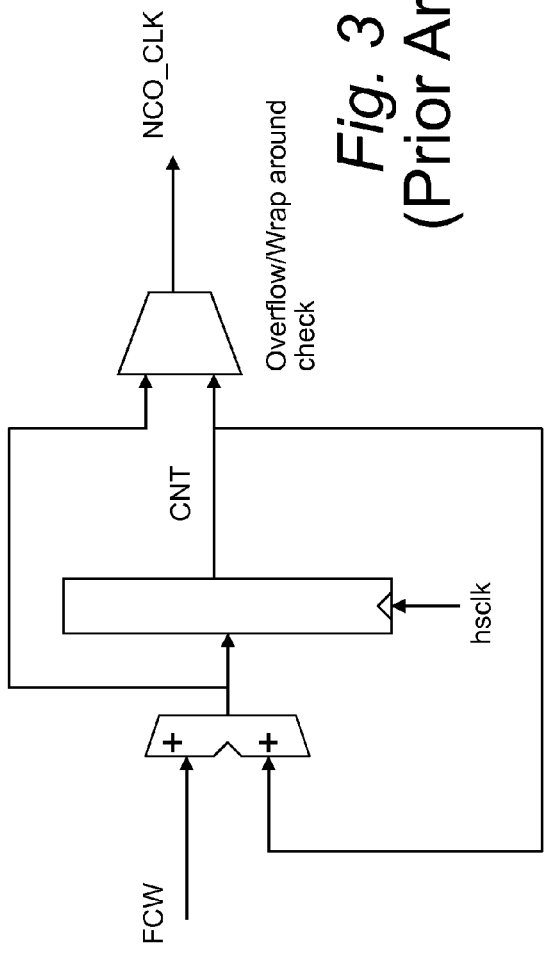
FIG. 3 is a block diagram illustrating a typical frequency based numerically controlled oscillator circuit.
Figure 4:
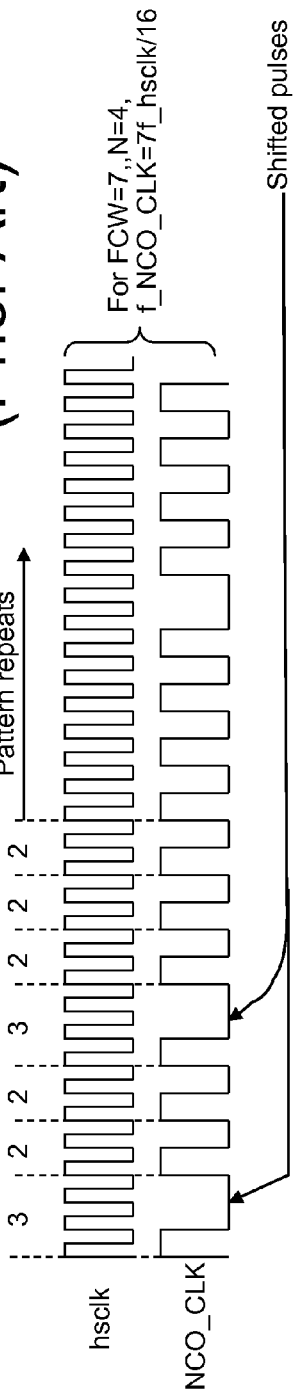
FIG. 4 illustrates a high speed clock signal input to a frequency based numerically controlled oscillator and the clock signal output by the time based numerically controlled oscillator.
Figure 5:
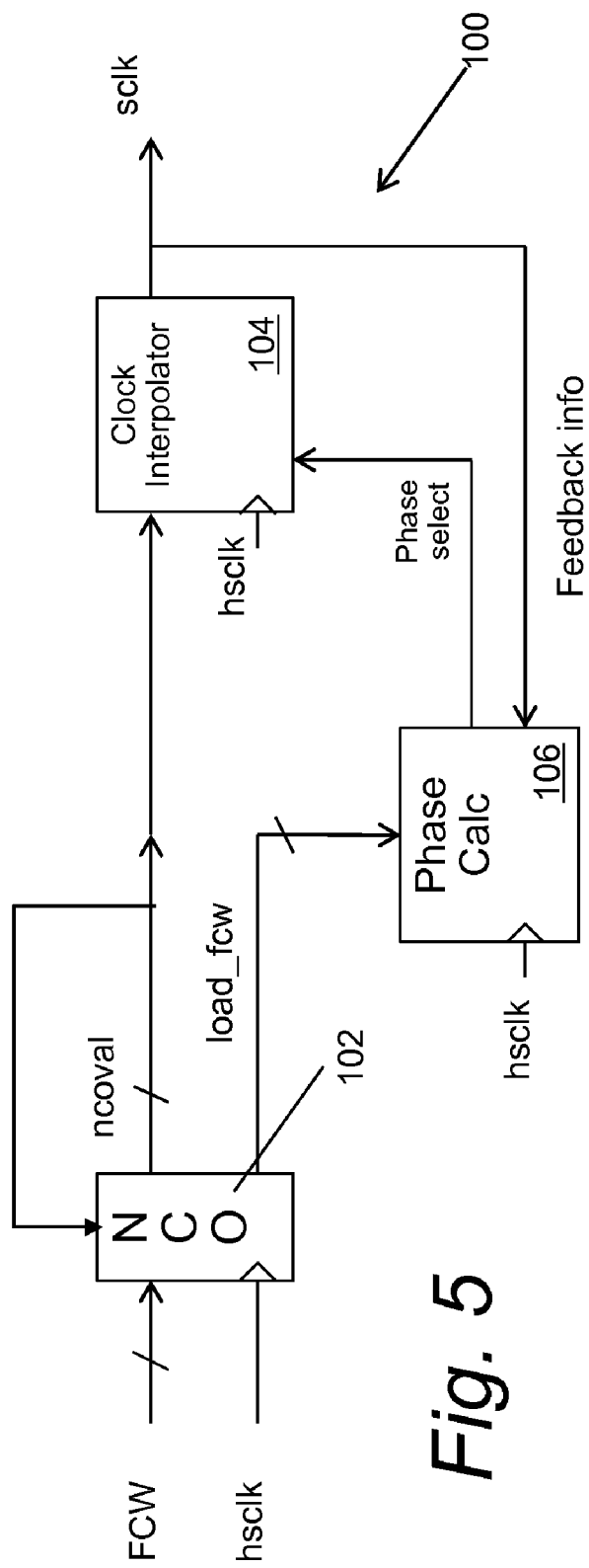
FIG. 5 is a block diagram illustrating a low jitter clock interpolator in accordance with an embodiment of the invention.

A low jitter clock interpolator circuit in accordance with an embodiment of the invention is illustrated in FIG. 5. The low jitter clock interpolator circuit 100 receives as inputs a high speed clock (hsclk) signal, and a FCW. The FCW is not necessarily static. The hsclk signal and the FCW are provided to a time based NCO 102, which generates an output clock signal (ncoval). The load_fcw signal of the time based NCO is provided to the clock interpolator circuit 104. The time based NCO also provides information to a phase calculator circuit 106. The clock interpolator circuit 104 creates different phases of the clock signal generated by the time based NCO (i.e. the ncoval signal) and the phase calculator circuit 106 is used to select the phase to output as the low jitter clock signal (sclk). As indicated above, the sclk signal can be jitter free to within the precision of the interpolator.

Figure 6:
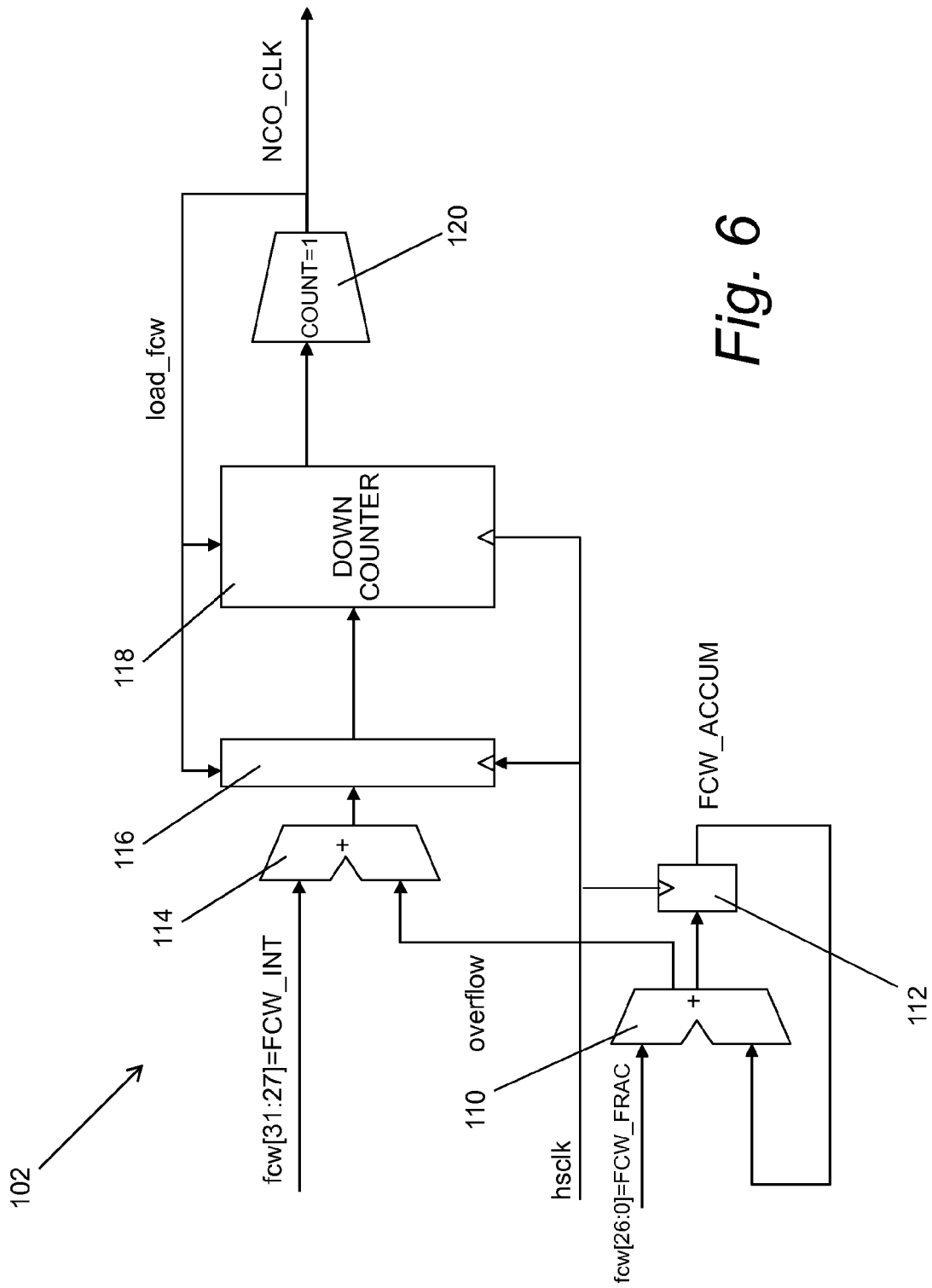
FIG. 6 is a block diagram illustrating the architecture of a time based numerically controlled oscillator that can be used in a low jitter clock interpolator in accordance with an embodiment of the invention.

The basic architecture of the time based NCO is illustrated in FIG. 6. The numerically controlled oscillator receives as its input the FCW and the hsclk signals. The top M bits of the FCW are designated as an "integer part" (FCW_INT) and the remaining LSBs as the "fractional part" (FCW_FRAC) of the FCW. In the illustrated embodiment, the FCW is a 32 bit unsigned value and the FCW_INT signal is designated as the bits FCW[31:27] and the FCW_FRAC signal is designated as the bits FCW[26:0]. The FCW_FRAC signal bits are provided to a first adder 110 that adds the FCW_FRAC bits with a buffered value (112) FCW_ACCUM. The output of the first adder 110 is then provided to a first buffer 112. The first adder includes an overflow bit output (overflow). The FCW_INT bits and the overflow bit are provided to a second adder 114. The output of the second adder is loaded into a second buffer 116 by a load_fcw signal. The load_fcw signal also loads the contents of the second buffer 116 into a down counter 118 that is clocked by the hsclk signal. The down counter 118 counts down from FCW_INT to 1 and generates a pulse (120) when the count=1, which triggers the load_fcw signal. In the illustrated embodiment, performance of the time based NCO is improved by accumulating a fractional part and adding the overflow bit to the LSB of the next FCW_INT.

Figure 7:
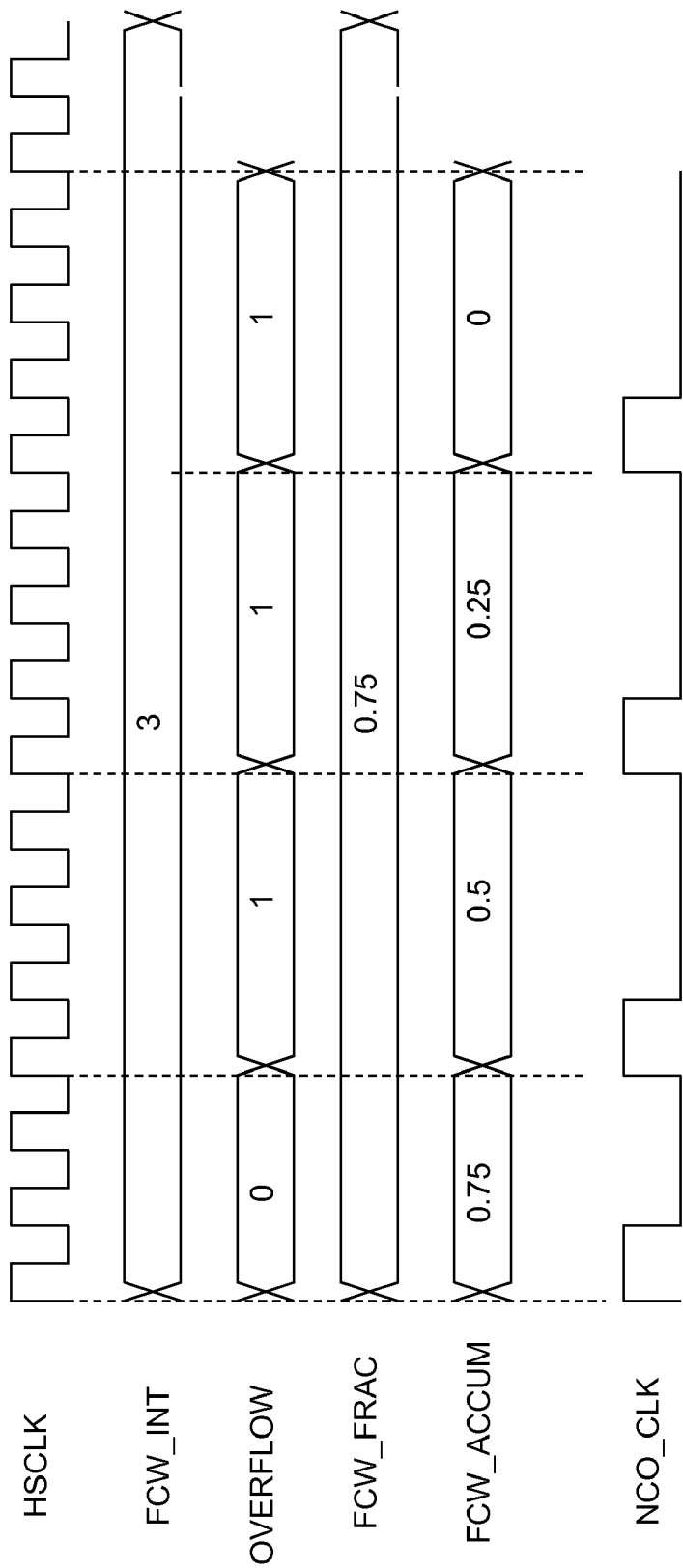
FIG. 7 illustrates signal waveforms from the time based NCO illustrated in FIG. 6 when the FCW is 3.75.

By way of example, the clock waveforms of the time based NCO illustrated in FIG. 6 when the FCW is 3.75 are shown in FIG. 7. The overflow pattern becomes 0, 1, 1, 1 repeated and these values are added to FCW_INT to give a repeated pattern of 3, 4, 4, 4, which has an average of 3.75.

Figure 8:
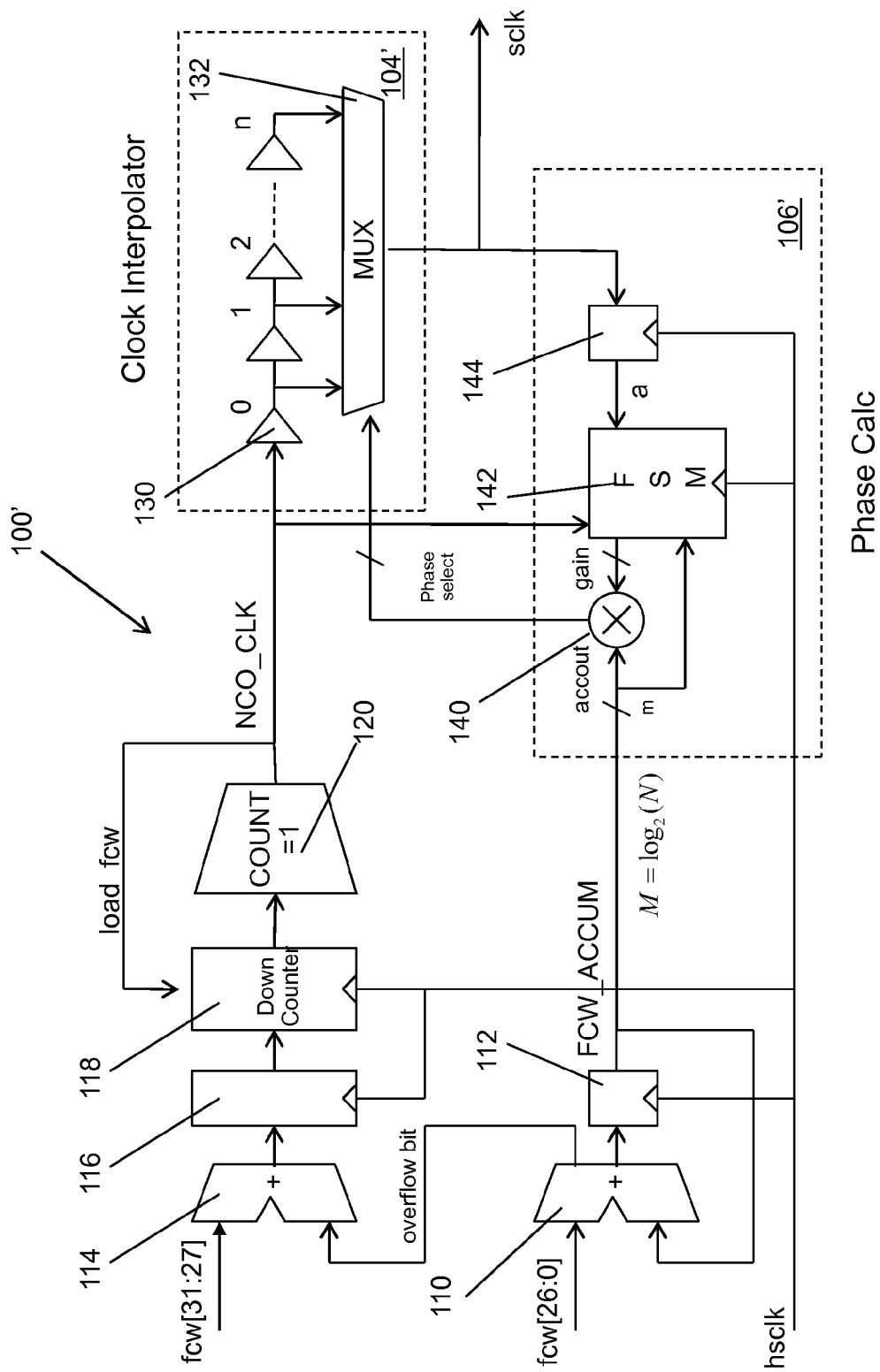
FIG. 8 is a block diagram illustrating the architecture of a low jitter clock interpolator in accordance with an embodiment of the invention.

A low jitter clock interpolator circuit incorporating the time based NCO illustrated in FIG. 6 in accordance with an embodiment of the invention is shown in FIG. 8. In the illustrated low jitter clock interpolator circuit 100', the NCO_CLK output of the time based NCO is provided to a clock interpolator circuit 104', which includes a tapped delay line 130 and a multiplexer 132. The value of FCW_ACCUM and the NCO_CLK output from the time based NCO are provided to a phase calculator circuit 106'. The phase calculator circuit 106' includes a multiplier 140, which multiplies the value of FCW_ACCUM and a gain output of a finite state machine (FSM) to produce a signal, which selects an input of the multiplexer 132 as its output. The finite state machine accepts as inputs the output of a buffer 144 containing the buffered output of the multiplexer and the value of FCW_ACCUM. The output of the multiplexer 132 provides the low jitter clock output (sclk) of the low jitter clock interpolator.

The rising edge of the output of the time based NCO coincides with the rising edge of the high speed clock. Each delay introduced by the tapped delay line 130 in the clock interpolator circuit 104' is a fraction of a high speed clock cycle. Therefore, the rising edge of the output of the NCO can be shifted by fractions of a high frequency clock period using the delay line. The phase calculator 106' selects the appropriate delay from the tapped delay line using the multiplexer 132 to provide a clock output having low jitter in its clock period. Typically the delay line includes a minimum number of taps so as to span at least one high speed clock period irrespective of process variation. In some instances, the tapped delay line will span more than one hsclk period and under such conditions a delay line calibration scheme similar to the schemes discussed below can be used to calibrate the delay line so as to exclude a certain number of taps at the end of the delay line so that the delay of the remaining taps span a hsclk period with maximum error equal to the delay of a single tap.

Due to variations in the manufacturing process the amount of each delay is unknown. All delay taps in the tapped delay line 130, however, can be assumed to be closely matched. The phase calculator 106' attempts to accommodate the uncertainty by selecting an output of the tapped delay line using the multiplexer 132 that introduces a delay proportional to the fraction FCW_ACCUM. In the illustrated embodiment, this is achieved by scaling FCW_ACCUM by a gain factor determined by the FSM 142. In many embodiments, the FSM determines the gain by looking at the falling (or rising edge) of the output signal (sclk). In a number of embodiments, the gain is adjusted by waiting for a rising edge on the NCO_CLK output (i.e. NCO_CLK=1) and then adjusting the value of the gain depending upon the values of FCW_ACCUM and a at the next hsclk rising edge.

The FSM 142 determines the appropriate gain when NCO_CLK=1 as follows:
If FCW_ACCUM=$2^m-1$ and a=1, then reduce gain
If FCW_ACCUM=$2^m-1$ and a=0, then do nothing
If FCW_ACCUM$\leq 2^m-2$ and a=1, then do nothing
If FCW_ACCUM$\leq 2^m-2$ and a=0, then increase gain The state machine outlined uses the value of the selected tapped delay line at the first hsclk rising edge following an NCO_CLK rising edge to determine the appropriate gain to apply to FCW_ACCUM. When the FCW_ACCUM is its maximum value (i.e. $2^m-1$), then the sclk value should transition from HIGH to LOW (i.e. have a falling edge) as the hsclk signal transitions from LOW to HIGH (i.e has a rising edge). If this does not occur (i.e. a=1 not 0), then the delay introduced by the selected tap is too large and the gain is reduced. When FCW_ACCUM is a value other than its maximum value (i.e. FCW_ACCUM$\leq 2^m-2$), then the sclk value should be high (i.e. 1) when hsclk signal transitions from LOW to HIGH (i.e. the falling edge of the sclk signal should occur after the rising edge of the hsclk signal). If not, then the delay introduced by the selected tap is too small and the gain should be increased. In this way, the FSM can adjust the gain until providing the scaled values of FCW_ACCUM to the multiplexer selects the appropriate tap in the delay line to achieve a desired delay. In many embodiments, an initialization sequence can be performed using an appropriate FCW so that the gain rapidly converges. The gain can then be stored and adjusted during operation as factors such as temperature impact the delays introduced by the clock interpolator.

Figure 9:
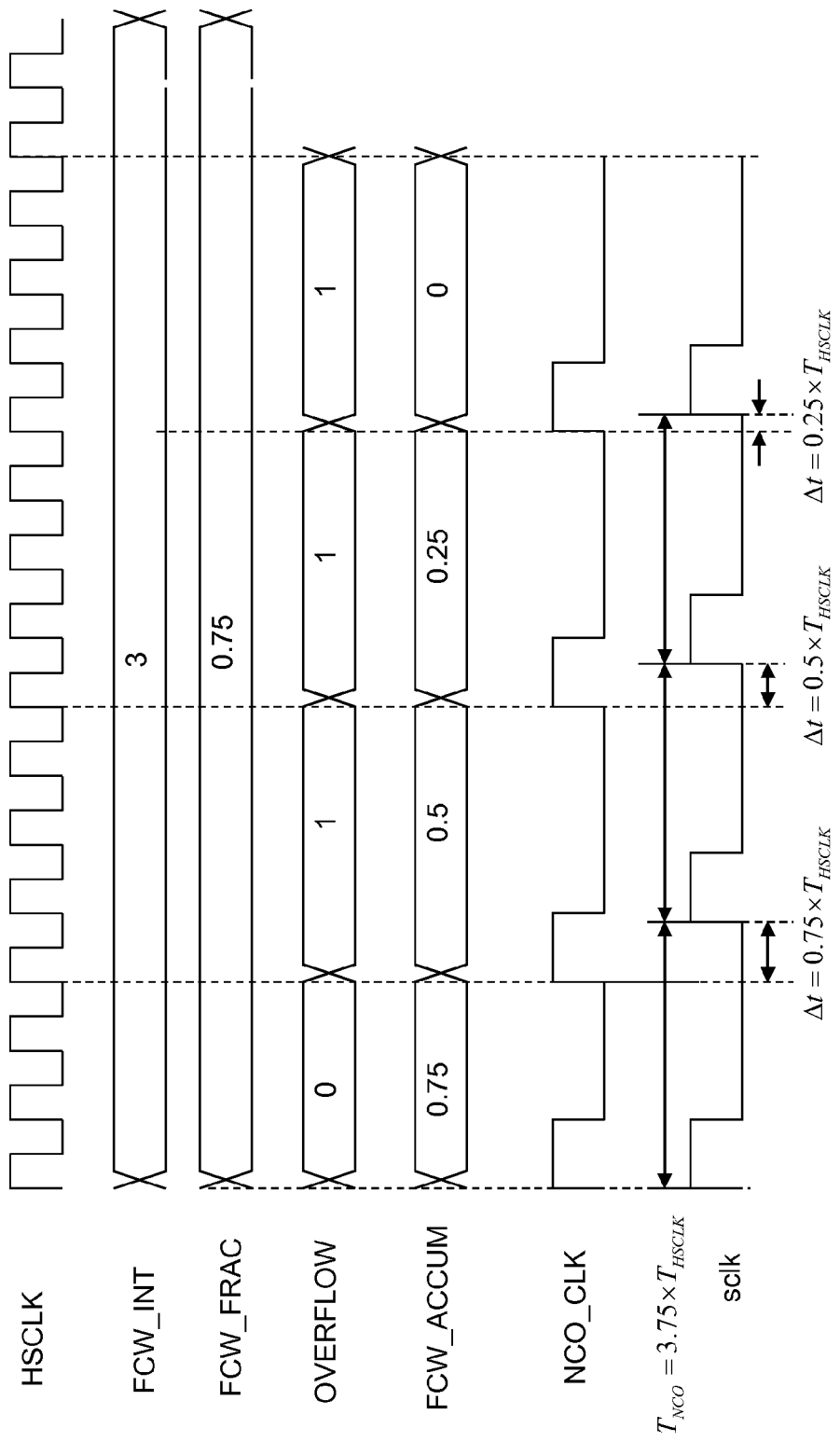
FIG. 9 illustrates signal waveforms from the low jitter clock interpolator illustrated in FIG. 8 when the FCW is 3.75.

By way of example, the clock waveforms of the low jitter clock interpolator illustrated in FIG. 8 when the FCW is 3.75 are shown in FIG. 9. The overflow pattern becomes 0, 1, 1, 1 repeated and these values are added to FCW_INT to give a repeated pattern of pulses separated by 3, 4, 4, 4, hsclk periods for the NCO_CLK signal, which has an average of 3.75 hsclk periods. The effect of the clock interpolation can be seen in the sclk signal, which is the output of the low jitter clock interpolator. By appropriately selecting the outputs from tapped delay line, the output sclk has a regular period of 3.75 HSCLK periods. Although the duty cycle of sclk is asymmetric, the sclk signal has an arbitrarily low jitter determined by the value of each delay introduced in the tapped delay line. The sclk signal can then be provided to another circuit that outputs a clock signal having an even duty cycle.

Although a specific FSM, phase calculator and clock interpolator are described above, alternative circuits including but not limited to FSMs that adjust gain based upon rising edges and/or other techniques that determine the scaling factor required to accommodate uncertainty introduced in the delays provided in a tapped delay line by manufacturing variations, phase calculators that select tapped delay line outputs using different techniques, and clock interpolators that introduce delays using any of a variety of circuits including but not limited to tapped delay lines can be utilized as appropriate to a specific application to interpolate between high speed clock periods in accordance with embodiments of the invention.

Figure 10:
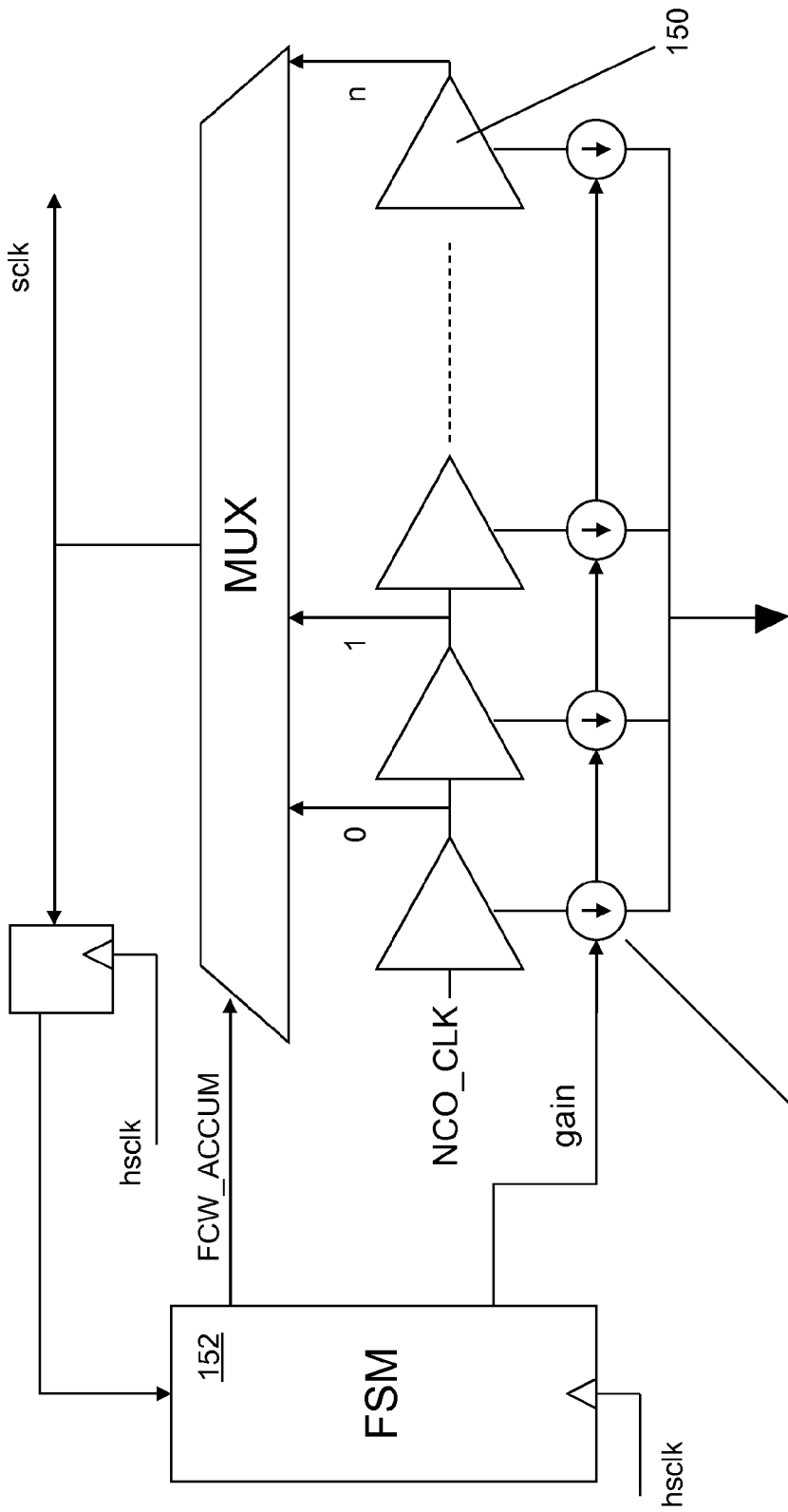
FIG. 10 is a block diagram illustrating a finite state machine and a current starved delay line that can be utilized in a low jitter clock interpolator circuit in accordance with an embodiment of the invention.

In several embodiments, a current starved delay line is used in place of a tapped delay line. A FSM and a current starved tapped delay line that can be incorporated within a low jitter clock interpolator circuit in accordance with an embodiment of the invention is illustrated in FIG. 10. The current starved delay line 150 can be controlled using a FSM 152 similar to the FSM discussed above with respect to FIG. 8, except that the gain value controls current DACs that increase or decrease the delay of the elements in the buffer chain. In embodiments that utilize current starved delay lines, all the delay taps in the chain are used and the FSM outputs the gain as a separate value along with FCW_ACCUM to control the delay in the delay line. Although tapped delay lines and current starved delay lines are discussed above, any of a variety of other delay lines and appropriate FSMs can be utilized in the implementation of a low jitter clock interpolator circuits in accordance with embodiments of the invention.

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed:

1. A low jitter clock interpolator circuit, comprising:
   a time based numerically controlled oscillator (NCO) configured to produce a NCO output in response to a high speed clock (hsclk) input and a frequency control word (FCW), where the output periods of the NCO output are integer multiples of the hsclk period and the average output period of the NCO output corresponds to the FCW;
   a clock interpolator circuit configured to receive the NCO output and the hsclk input and to generate a plurality of different phases of the NCO output; and
   a phase calculator circuit configured to select phases generated by the clock interpolator to produce a low jitter clock signal output having an output period that corresponds to the FCW.

2. The low jitter clock interpolator circuit of claim 1, wherein the jitter in the low jitter clock signal output is within the precision of the phases generated by the clock interpolator circuit.

3. The low jitter clock interpolator circuit of claim 1, wherein:
   a plurality of bits of the FCW are indicative of an integer part of the FCW;
   a plurality of bits of the FCW are indicative of a fractional part of the FCW;
   the time based NCO accumulates the fractional part of the FCW; and
   the phase calculator circuit selects a phase generated by the clock interpolator circuit based upon the accumulated fractional part of the FCW.

4. The low jitter clock interpolator circuit of claim 3, wherein the NCO comprises:
   a first adder configured to add the bits corresponding to the factional part of the FCW to an accumulated value stored in a first buffer and to output the sum to the first buffer and to provide an overflow bit output in response to overflow of the first adder;
   a second adder configured to sum the bits corresponding to the integer part of the FCW with the overflow bit output of the first adder and to provide the sum to a second buffer; and
   a down counter configured to load the value from the second buffer, count down to 1 and generate a puke on the NCO output when the count equals 1.

5. The low jitter clock interpolator of claim 3, wherein the clock interpolator circuit comprises:
   a tapped delay line configured to receive the NCO output as an input; and
   a multiplexer configured to select a tap from the tapped delay line as the low jitter clock signal output in response to an input received from the phase calculator circuit.

6. The low jitter clock interpolator of claim 5, wherein the phase calculator circuit is configured to scale the accumulated fractional part of the FCW and to provide the result to the multiplexer to select a tap from the tapped delay line as the low jitter clock signal output.

7. The low jitter clock interpolator of claim 6, wherein:
   the tapped delay line includes a minimum number of taps so as to span at least one high speed clock period; and
   the phase calculator circuit is configured to calibrate the gain so as to exclude at least one tap at the end of the delay line so that the delay of the remaining taps span a hsclk period.

8. The low jitter clock interpolator of claim 3, wherein the clock interpolator circuit comprises:
   a current starved delay line configured to receive the NCO output as an input, were the gains of the delays in the current starved delay line are controlled via a plurality of current digital to analog converters; and
   a multiplexer configured to select a tap from the current starved delay line as the low jitter clock signal output in response to an input received from the phase calculator.

9. The low jitter clock interpolator of claim 8, wherein the phase calculator circuit is configured to control the gains of the delays in the current starved delay line using the digital to analog converters and to provide the accumulated fractional part of the FCW to the multiplexer to select a tap from the tapped delay line as the low jitter clock signal output.

10. The low jitter clock interpolator of claim 9, wherein the phase calculator circuit is configured to calibrate the gains of the delays in the current starved delay line so that the current starved delay line spans a single hsclk period.

11. A method of generating a low jitter clock output, comprising:
    generating a clock output using a time based numerically controlled oscillator (NCO) in response to a high speed clock (hsclk) input and a frequency control word (FCW) input, where the output periods of the clock output are integer multiples of the hsclk period and the average output period of the clock output corresponds to the FCW;
    interpolating the clock output using a clock interpolator circuit to produce a plurality of clock output phases; and selecting clock output phases using a phase calculator circuit to produce a low jitter clock output having an output period that corresponds to the FCW.

12. The method of claim 11, wherein:
generating a clock output using a time based NCO in response to the hsclk input and the FCW input further comprises:
accumulating a plurality of bits of the FCW that are indicative of a fractional part of the FCW in the NCO; and
selecting clock output phases using a phase calculator circuit to produce a low jitter clock output having an output period that corresponds to the FCW, further comprises:
selecting clock output phases from the clock interpolator using the phase calculator circuit based upon the accumulated fractional part of the FCW.

13. The method of claim 12, wherein:
accumulating a plurality of bits of the FCW that are indicative of a fractional part of the FCW in the NCO comprises:
accumulating a fractional part of the FCW in a first buffer by adding the plurality of bits from the FCW control word corresponding to a fractional part of the FCW and the previous value in the first buffer; and
generating a clock output using a time based NCO in response to the hsclk input and the FCW input further comprises:
providing an overflow bit output to a second adder in response to an overflow of the first adder;
accumulating an integer part of the FCW in a second buffer by adding the plurality of bits from the FCW corresponding to the integer part of the FCW and the overflow bit output by the first adder using the second adder;
loading the value in the second buffer into a down counter circuit when a clock output puke is generated; and
counting down from the value loaded into the down counter circuit and generating a clock output puke when the count equals 1.

14. The method of claim 12, wherein interpolating the clock output using a clock interpolator circuit to produce a plurality of clock output phases further comprises providing the clock output to a delay line having a plurality of delayed outputs.

15. The method of claim 14, wherein selecting clock output phases from the clock interpolator using the phase calculator circuit based upon the accumulated fractional part of the FCW further comprises:
selecting one of the outputs of the delay line as the low jitter clock output using a multiplexer based upon the accumulated fractional part of the FCW.

16. The method of claim 15, wherein the delay line is a tapped delay line.

17. The method of claim 16, wherein the tapped delay line includes a minimum number of taps so as to span at least one high speed clock period.

18. The method of claim 15, wherein selecting one of the outputs of the delay line as the low jitter clock output using a multiplexer based upon the accumulated fractional part of the FCW further comprises:
scaling the accumulated fractional part of the FCW by a gain factor using the phase calculator circuit; and
providing the scaled accumulated fractional part of the FCW to the multiplexer to select an output of the delay line.

19. The method of claim 18, further comprising calibrating the gain factor so as to exclude at least one tap at the end of the delay line so that the delay of the remaining taps span a hsclk period.

20. The method of claim 15, wherein the delay line is a current starved delay line.

21. The method of claim 20, wherein selecting one of the outputs of the delay line as the low jitter clock output using a multiplexer based upon the accumulated fractional part of the FCW further comprises:
calibrating the gains of the delays in the current starved delay line using the phase calculator so that the current starved delay line spans one hsclk period; and
providing the accumulated fractional part of the FCW to the multiplexer to select an output of the delay line.

* * * * *

UNITED STATES PATENT AND TRADEMARK OFFICE
CERTIFICATE OF CORRECTION

PATENT NO. : 8,384,464 B1  
APPLICATION NO. : 13/084453  
DATED : February 26, 2013  
INVENTOR(S) : Shah Page 1 of 1

It is certified that error appears in the above-identified patent and that said Letters Patent is hereby corrected as shown below:

In the Claims

Col. 8, Claim 4, line 7, delete "factional" and insert --fractional--.

Signed and Sealed this  
Twenty-fifth Day of August, 2015

Michelle K. Lee  
*Director of the United States Patent and Trademark Office*